(12) United States Patent
Shih et al.

(10) Patent No.: US 11,148,864 B1
(45) Date of Patent: Oct. 19, 2021

(54) STORAGE CONTAINER FOR ELECTRONIC DEVICES

(71) Applicant: CHIPBOND TECHNOLOGY CORPORATION, Hsinchu (TW)

(72) Inventors: Cheng-Hung Shih, Changhua County (TW); Tsuo-Yun Chu, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/169,653

(22) Filed: Feb. 8, 2021

(30) Foreign Application Priority Data

Jul. 7, 2020 (TW) .................................. 109122893

(51) Int. Cl.
*B65D 81/05* (2006.01)
*B65D 25/10* (2006.01)
*B65D 85/38* (2006.01)

(52) U.S. Cl.
CPC ........... *B65D 81/05* (2013.01); *B65D 25/103* (2013.01); *B65D 85/38* (2013.01); *B65D 2585/30* (2013.01)

(58) Field of Classification Search
CPC ...... B65D 81/05; B65D 25/103; B65D 85/38; B65D 2585/30
USPC ........................................................ 206/711
See application file for complete search history.

(56) References Cited

U.S. PATENT DOCUMENTS

| 10,242,899 B2 | 3/2019 | Kuo et al. | |
| 2015/0030416 A1* | 1/2015 | Sakiya | B25J 11/0095 |
| | | | 414/217.1 |
| 2015/0041360 A1* | 2/2015 | Watson | H01L 21/67393 |
| | | | 206/711 |

FOREIGN PATENT DOCUMENTS

| CN | 210913451 U | 7/2020 |
| EP | 1646082 A1 | 4/2006 |
| TW | M467176 U | 12/2013 |

OTHER PUBLICATIONS

Taiwanese Notice of Allowance dated Apr. 13, 2021 for Taiwanese Patent Application No. 109122893, 3 pages.

* cited by examiner

*Primary Examiner* — Jacob K Ackun
(74) *Attorney, Agent, or Firm* — Demian K. Jackson; Jackson IPG PLLC

(57) ABSTRACT

The present invention discloses a storage container for electronic devices, especially for wafer frames. The storage container includes a body and a stop rod that is provided to open or close a pick-and-place path in the body. The pick-and-place path is open to allow the wafer frames placed in the body to be taken out when a recess of the stop rod is located in the pick-and-place path. On the contrary, the pick-and-place path is closed when a blocking part of the stop rod is located in the pick-and-place path so as to protect the wafer frames placed in the body from falling out from the storage container.

15 Claims, 9 Drawing Sheets

STORAGE CONTAINER FOR ELECTRONIC DEVICES

FIELD OF THE INVENTION

This invention relates to a storage container, and more particularly to a storage container able to be open and closed alternatively for holding electronic devices such as wafers.

BACKGROUND OF THE INVENTION

During wafer fabrication, a wafer supported on a wafer ring is processed in several stations and placed in a wafer container or a wafer cassette for storage or delivery purpose. The wafer is put into a conventional wafer cassette with the wafer ring via an entrance of a linear path. A bottom plate is mounted at the other end of the linear path, opposite to the entrance, and a magnetic element is disposed on the bottom plate to attract the wafer ring.

However, there is no any stopper located on the entrance of the linear path of the conventional wafer cassette, the wafer and the wafer ring may fall out together from the wafer cassette.

SUMMARY

One object of the present invention is to protect electronic devices or wafer frames from falling out of a storage container.

A storage container of the present invention includes a body and a stop rod. The body includes a first inner surface, a second inner surface and an accommodation space having an access opening, the first and second inner surfaces are located at both sides of the accommodation space, respectively. There are first grooves recessed from the first inner surface and second grooves recessed from the second inner surface, each of the first and second grooves communicates with the accommodation space and the access opening. Each of the first grooves, each of the second grooves and the accommodation space form a pick-and-place path along a first direction. The stop rod is rotatably mounted on the body along a second direction intersecting with the first direction and includes a blocking part and a recess. The blocking part is located at one side of the recess, and the blocking part and the recess are configured to be located in the pick-and-place path alternatively. The pick-and-place path is open as the recess is located in the pick-and-place path, and on the contrary, the pick-and-place path is closed as the blocking part is located in the pick-and-place path.

The blocking part and the recess of the stop rod are able to be moved to the pick-and-place path alternatively because the stop rod is rotatably mounted in the body. The recess located in the pick-and-place path allows the pick-and-place path to be open so that wafer frames or other electronic devices placed in the body can be passed through the recess to be taken out. And the blocking part located in the pick-and-place path can block the pick-and-place path to prevent wafer frames or other electronic devices placed in the body from falling out.

DETAILED DESCRIPTION OF THE INVENTION

Figure 3:
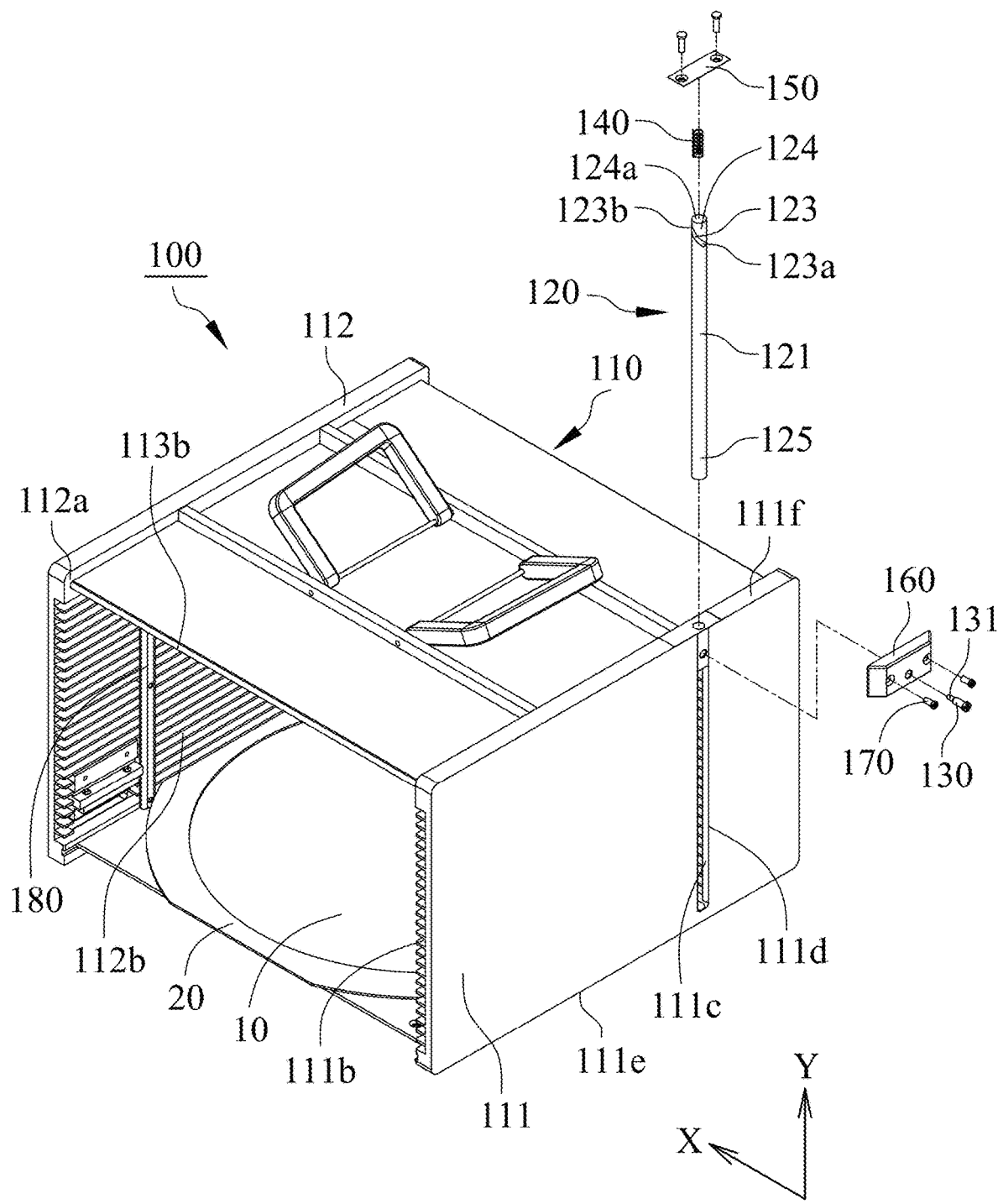
FIG. 3 is a perspective exploded diagram illustrating a storage container for electronic devices in accordance with one embodiment of the present invention.
Figure 4:
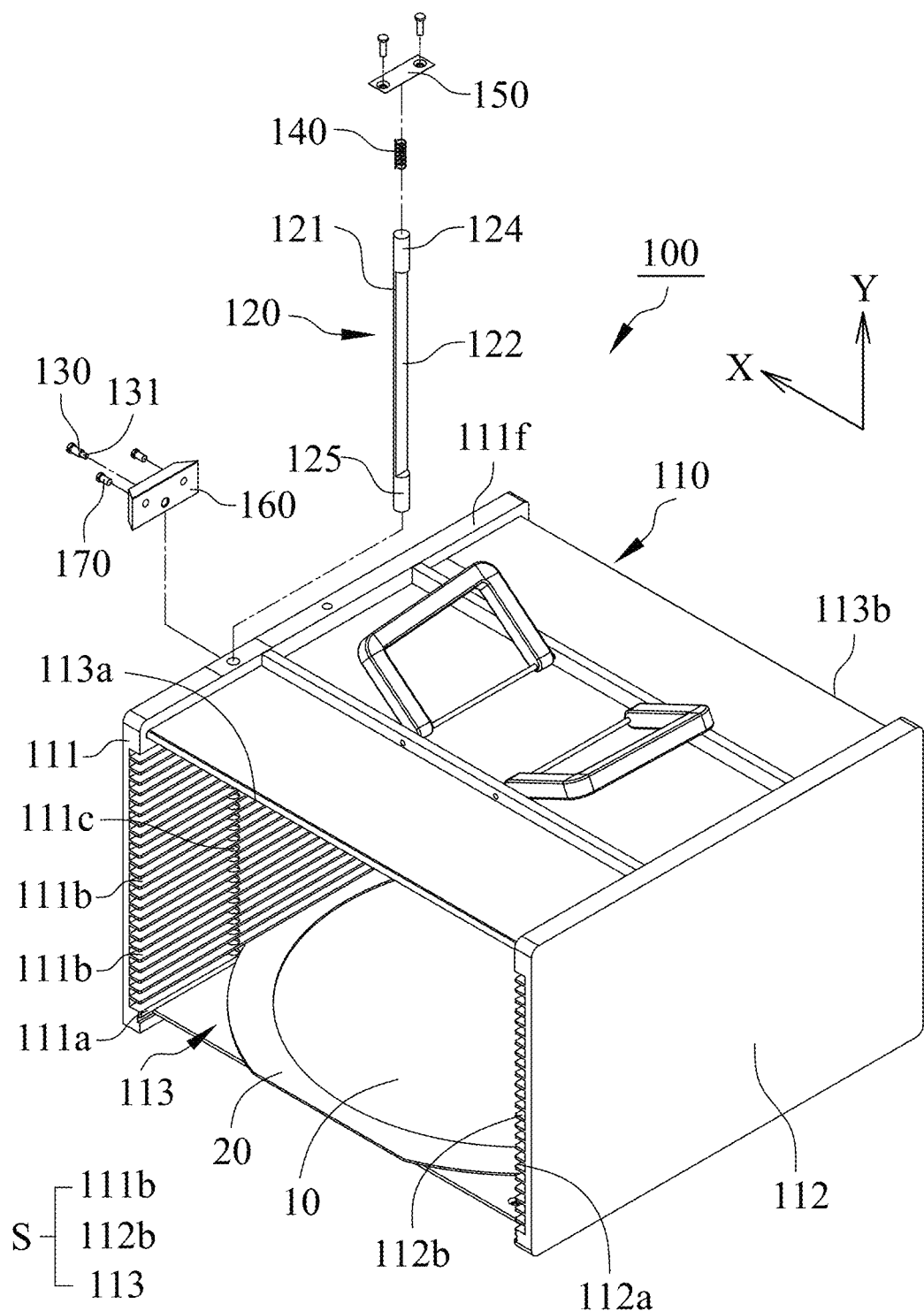
FIG. 4 is a perspective exploded diagram illustrating a storage container for electronic devices in accordance with one embodiment of the present invention.
Figure 5:
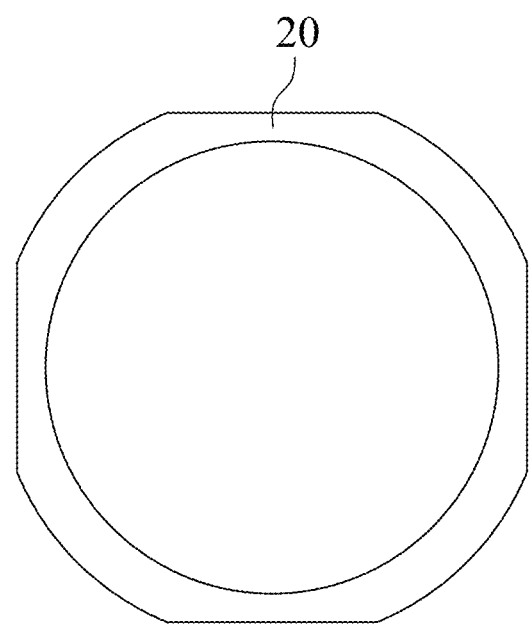
FIG. 5 is a top view of a wafer frame.

With reference to FIGS. 1 to 4, a storage container 100 in accordance with one embodiment of the present invention is provided to storage electronic devices or wafer frames 20 (as shown in FIG. 5) provided to carry wafers 10. The storage container 100 is used to storage the wafer frames 20 in this embodiment, and it can be used to storage other electronic devices in other embodiment.

With reference to FIGS. 1 to 4, the storage container 100 includes a body 110 and a stop rod 120. The body 110 has a first inner surface 111a, a second inner surface 112a and an accommodation space 113 having an access opening 113a. The first inner surface 111a and the second inner surface 112a are located at both sides of the accommodation space 113, respectively. In this embodiment, the accommodation space 113 exists between a first lateral plate 111 and a second lateral plate 112 of the body 110, the first inner surface 111a and the second inner surface 112a are inner surfaces of the first lateral plate 111 and the second lateral plate 112 respectively, and they face to each other. There are multiple first grooves 111b recessed from the first inner surface 111a and multiple second grooves 112b recessed from the second inner surface 112a, and the first grooves 111b and the second grooves 112b connect with the accommodation space 113 and the access opening 113a. With reference to FIGS. 3, 4, 7 and 9, each of the first grooves 111b, each of the second grooves 112b and the accommodation space 113 form a pick-and-place path S along a first direction X, and the wafer frames 20 can be picked out from or placed in the body 110 through the pick-and-place path S.

Figure 6:
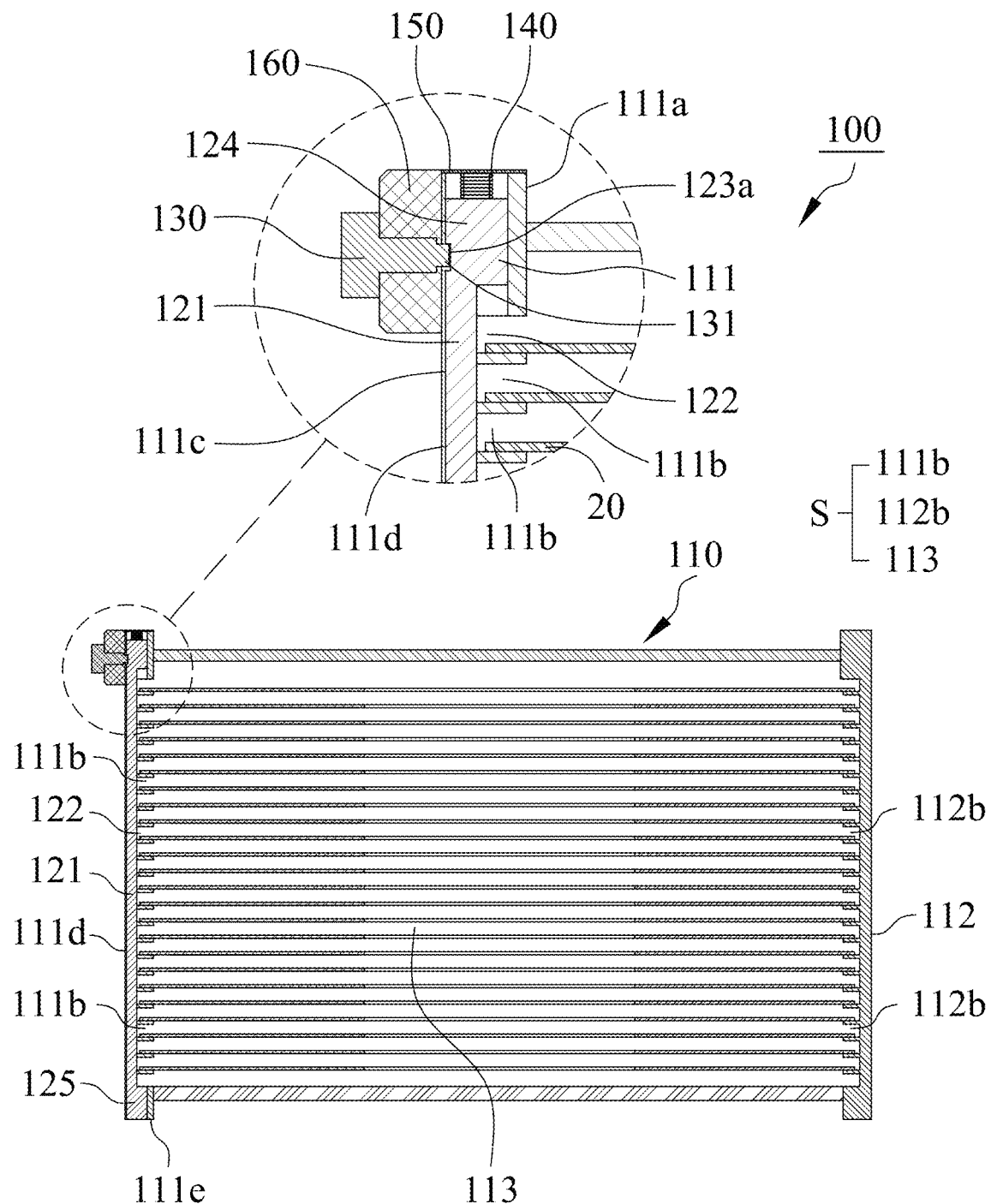
FIG. 6 is a cross-section view diagram illustrating a storage container for electronic devices in accordance with one embodiment of the present invention.

With reference to FIGS. 3 and 4, along a second direction Y intersecting with the first direction X, the stop rod 120 is rotatably mounted on the body 110. In this embodiment, there is an accommodation hole 111c in the first lateral plate 111 along the second direction Y, and as shown in FIGS. 3, 4 and 6, each of the first grooves 111b communicates with the accommodation hole 111c, and the stop rod 120 is rotatably located in the accommodation hole 111c. Preferably, the accommodation hole 111c penetrates through a bottom surface 111e of the first lateral plate 111.

Figure 7:
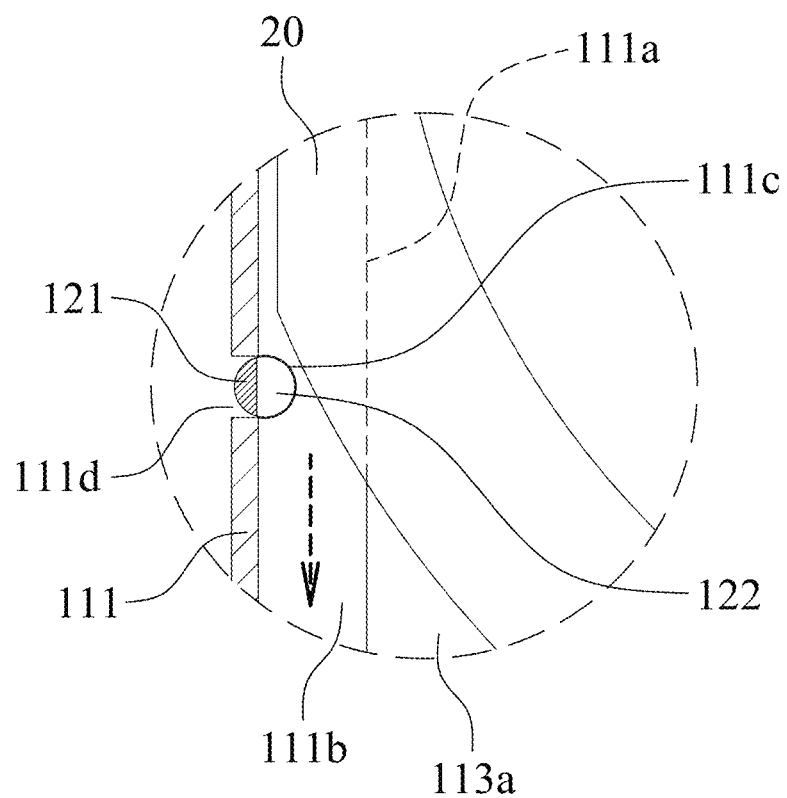
FIG. 7 is a partial enlarged cross-section view diagram illustrating a storage container for electronic devices in accordance with one embodiment of the present invention.
Figure 8:
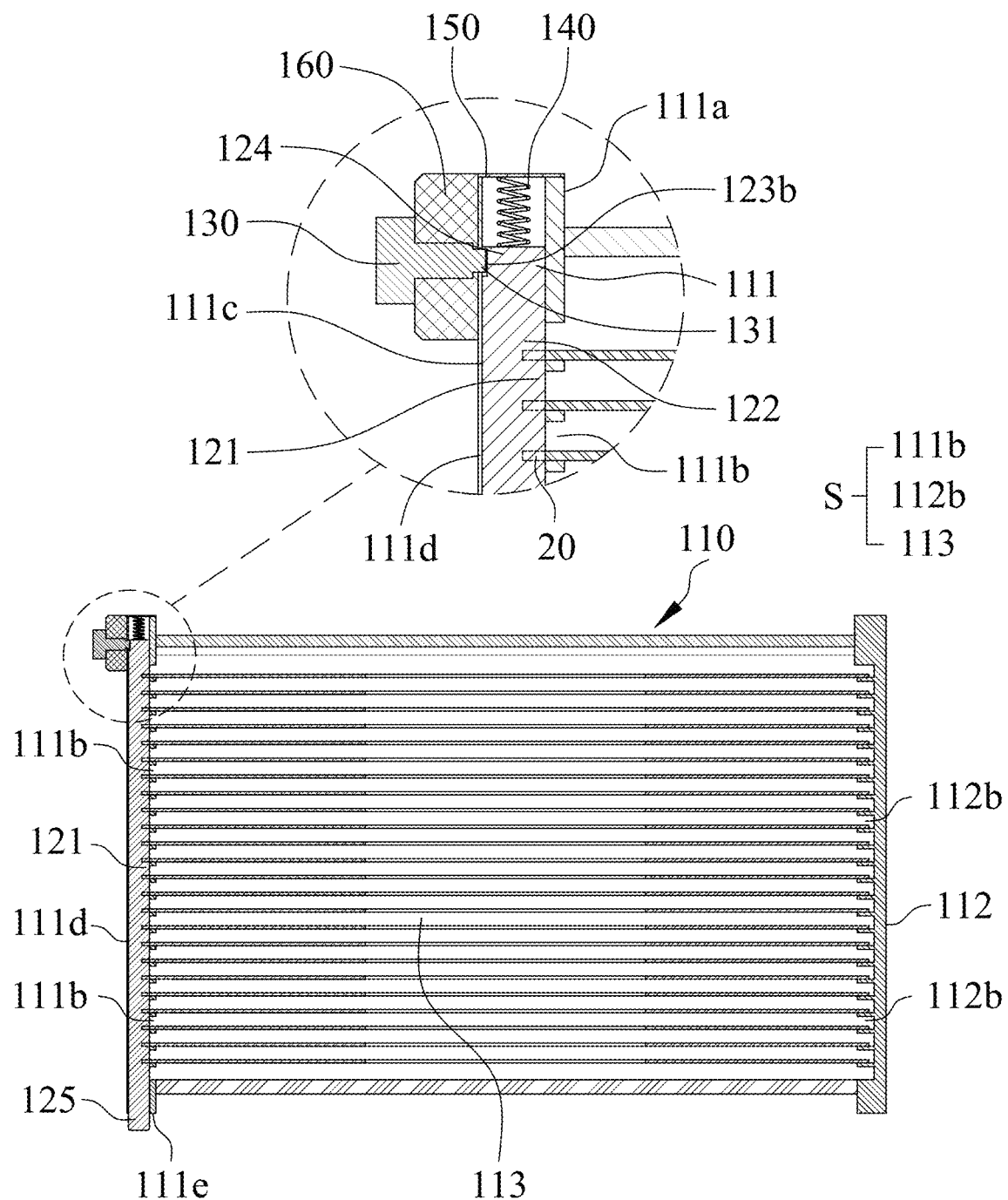
FIG. 8 is a cross-section view diagram illustrating a storage container for electronic devices in accordance with one embodiment of the present invention.
Figure 9:
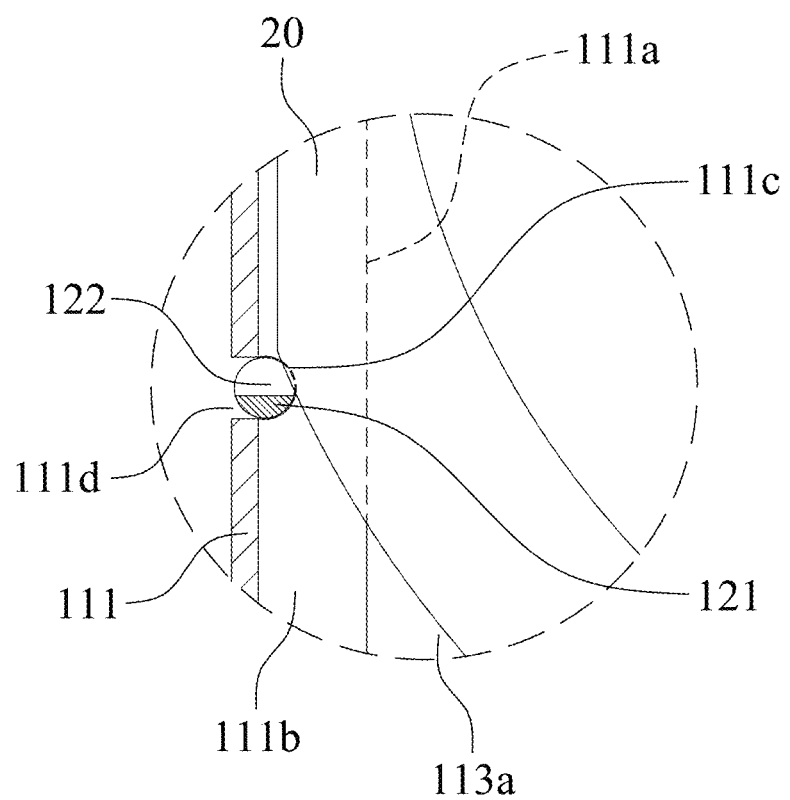
FIG. 9 is a partial enlarged cross-section view diagram illustrating a storage container for electronic devices in accordance with one embodiment of the present invention.

With reference to FIGS. 3 and 4, the stop rod 120 includes a blocking part 121 and a recess 122, and the blocking part 121 is located at one side of the recess 122. Rotating the stop rod 120 allows the blocking part 121 or the recess 122 to be located in the pick-and-place path S. With reference to FIGS. 4, 6 and 7, as the stop rod 120 is rotated to move the recess 122 to the pick-and-place path S, the pick-and-place path S is open because the recess 122 communicates with each of the first grooves 111b. With reference to FIGS. 8 and 9, on the contrary, the pick-and-place path S is blocked by the blocking part 121 when rotating the stop rod 120 to move the blocking part 121 to the pick-and-place path S. The blocking part 121 of the stop rod 120 is provided to close the pick-and-place path S.

With reference to FIGS. 3 and 4, the storage container 100 of this embodiment further includes a restriction element 130 mounted on the body 110. Preferably, the restriction element 130 is mounted on the first lateral plate 111 of the body 110 with the help of a holding element 160 that is fixed on the first lateral plate 111 by a screw 170.

With reference to FIGS. 3, 4, 6 and 8, in this embodiment, the stop rod 120 further includes a guidance slot 123 and the restriction element 130 includes a restriction part 131. The restriction part 131 is located in the accommodation hole 111c of the first lateral plate 111 and inserted into the guidance slot 123 to restrict the rotation angle of the stop rod 120.

With reference to FIGS. 3, 6 and 8, the guidance slot 123 has a first end 123a and a second end 123b, and preferably, it is a helix slot recessed on the stop rod 120. In this embodiment, the stop rod 120 further includes a top part 124 and a bottom part 125 that are located at both ends of the blocking part 121, respectively. The guidance slot 123 is recessed on the top part 124, and the distance from the first end 123a to an upper surface 124a of the top part 124 is higher than that from the second end 123b to the upper surface 124a of the top part 124.

FIG. 6 shows the storage container 100 placed on a table (not shown). The bottom part 125 of the stop rod 120 is located at a first position while the stop rod 120 is rotated to make the restriction part 131 of the restriction element 130 located in the first end 123a of the guidance slot 123. In this embodiment, the bottom part 125 located at the first position is inside the accommodation hole 111c. With reference to FIGS. 4, 6 and 7, the recess 122 of the stop rod 120 is located in the pick-and-place path S while the restriction part 131 of the restriction element 130 is located in the first end 123a of the guidance slot 123 such that the pick-and-place path S is open and the wafer frames 20 can be picked out from the body 110 or pass through the access opening 113a and the recess 122 to be placed in the body 110.

With reference to FIG. 8, as the storage container 100 is picked up, the stop rod 120 moves downward due to gravity. Moreover, because of the restriction part 131 of the restriction element 130 that is inserted into the guidance slot 123 recessed on the stop rod 120, the location of the restriction part 131 in the guidance slot 123 is changed from the first end 123a to the second end 123b as the stop rod 120 rotates and moves down under the force of gravity. The bottom part 125 of the stop rod 120 moves to a second position from the first position while the restriction part 131 is located in the second end 123b of the guidance slot 123. And in this embodiment, the bottom part 125 located at the second position protrudes from the bottom surface 111e of the first lateral surface 111. When the restriction part 131 is located in the second end 123b of the guidance slot 123 as shown in FIGS. 8 and 9, it can be seen that the blocking part 121 of the stop rod 120 is located in the pick-and-place path S to close the pick-and-place path S. Thus, the wafer frames 20 placed in the body 110 are blocked by the blocking part 121 to reduce the risk of falling from the body 110.

With reference to FIGS. 3, 4, 6 and 8, the storage container 100 further includes an elastic element 140 that is placed in the accommodation hole 111c of the body 110 to push the stop rod 120 along the second direction Y. In this embodiment, the accommodation hole 111c penetrates through a top surface 111f of the first lateral plate 111, the storage container 100 further includes a stop plate 150 mounted on the first lateral plate 111, and the elastic element 140 is stuck between the stop plate 150 and the stop rod 120. As shown in FIG. 6, the elastic element 140 is pressed by the stop rod 120 when the storage container 100 is placed on a table. With reference to FIG. 8, as the storage container 100 is picked up, the elastic element 140 apply a force to move the stop rod 120 such that the stop rod 120 has a rotation restricted by the restriction part 131. As a result, the location of the restriction part 131 in the guidance slot 123 is changed from the first end 123a to the second end 123b.

Figure 1:
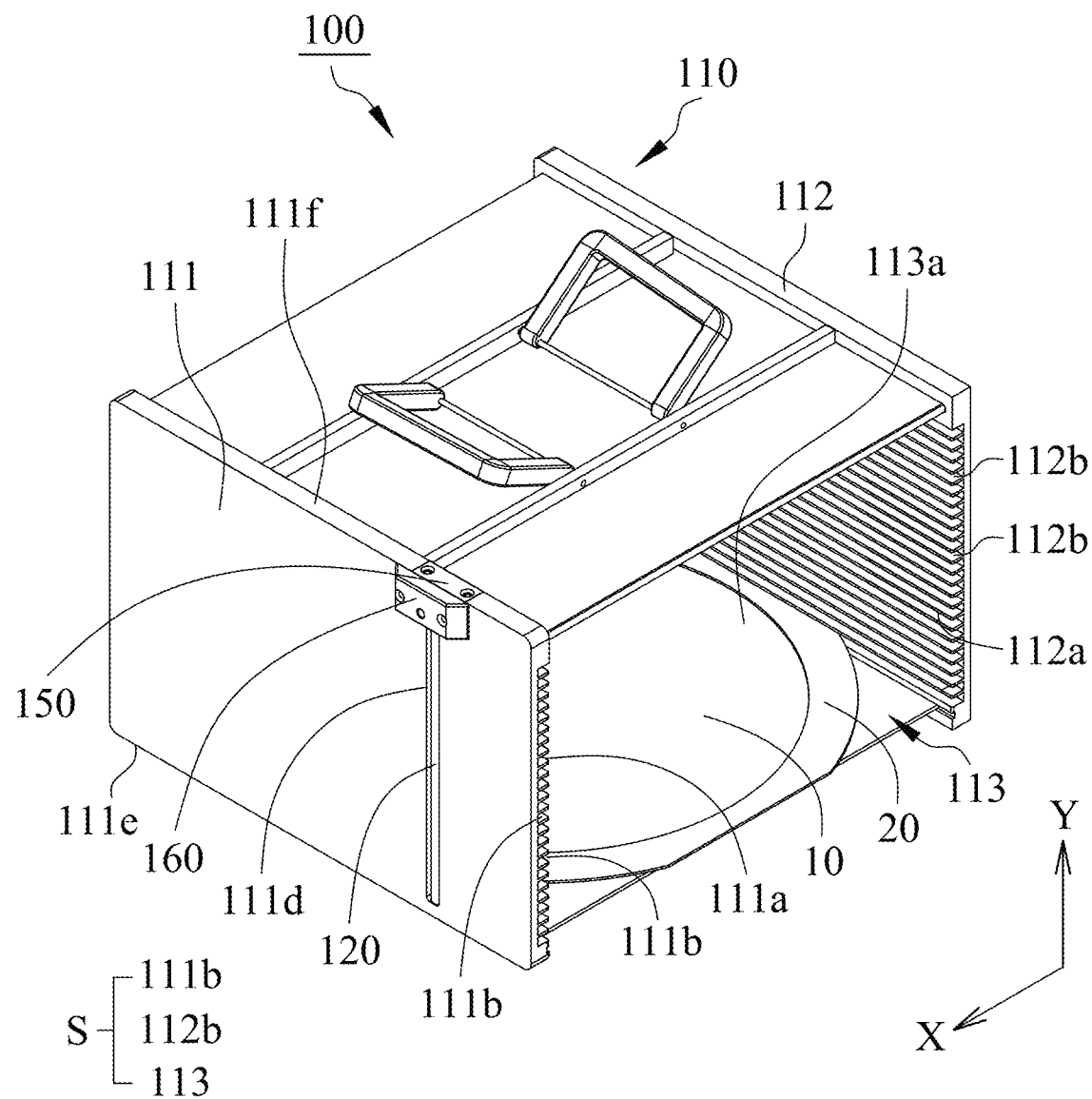
FIG. 1 is a perspective assembly diagram illustrating a storage container for electronic devices in accordance with one embodiment of the present invention.
Figure 2:
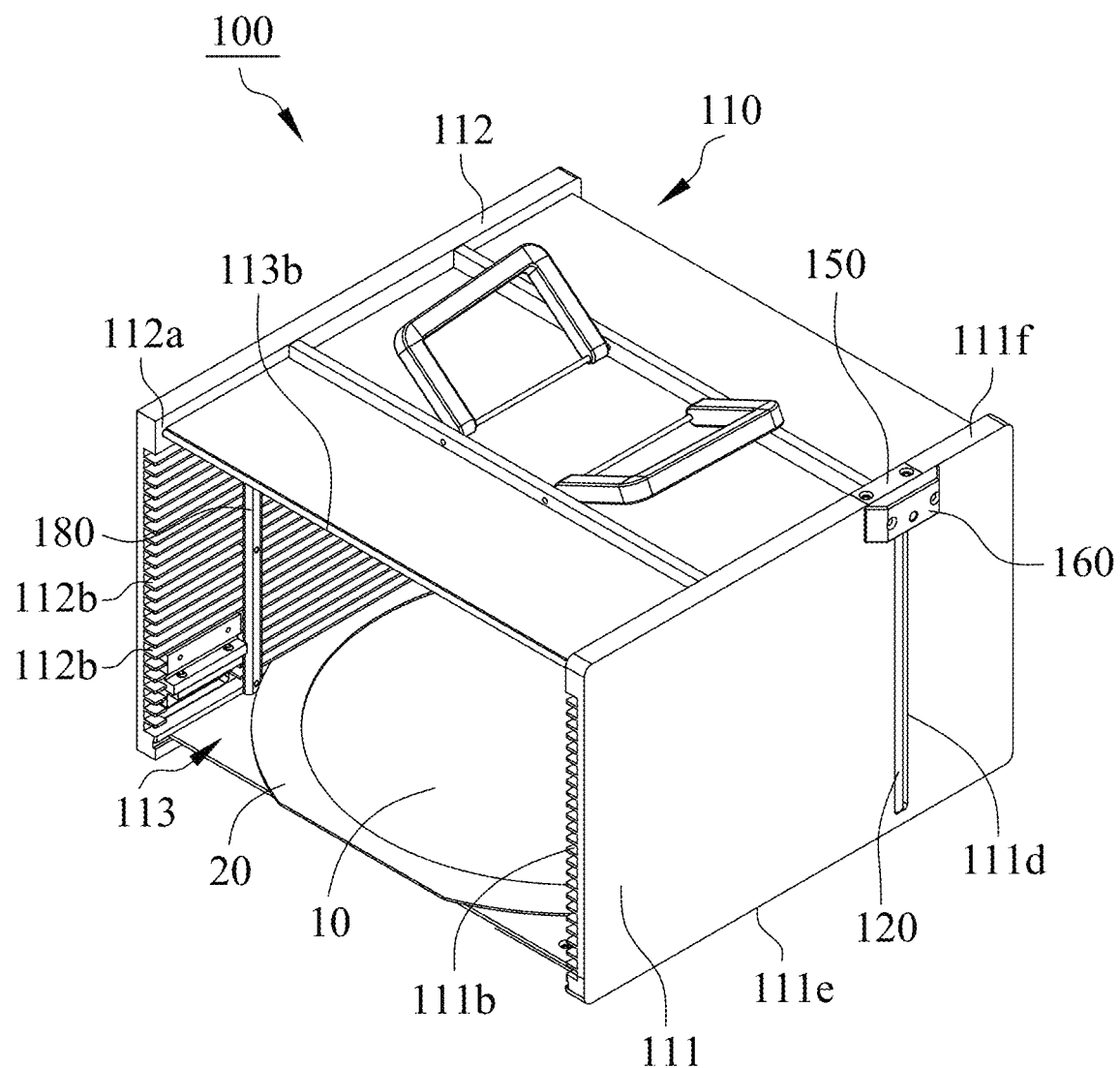
FIG. 2 is a perspective assembly diagram illustrating a storage container for electronic devices in accordance with one embodiment of the present invention.

With reference to FIGS. 1 to 4, preferably, the accommodation hole 111c has a window 111d open on an outer surface of the first lateral plate 111. The blocking part 121 and the recess 122 of the stop rod 120 are viewable from the window 111d so as to confirm which one of them is located in the pick-and-place path S. With reference to FIGS. 2 and 4, if the accommodation space 113 has another opening 113b, a blocker 180 is required in the storage container 110. The blocker 180 is mounted in the accommodation space 113 and close to the opening 113b in order to prevent the wafer frames 20 from falling out the body 110 from the opening 113b.

The stop rod 120 mounted in the body 110 is rotatable to allow the blocking part 121 and the recess 122 to be moved to the pick-and-place path S alternatively. As shown in FIG. 7, the pick-and-place path S is open while the recess 122 of the stop rod 120 is moved to be located in the first grooves 111b, thus the wafer frames 20 can be taken out from the access opening 113a and placed in the body 110 through the pick-and-place path S. On the other hand, while the blocking part 121 is moved to the first grooves 111b by rotating the stop rod 120 as shown in FIG. 9, the pick-and-place path S is unopen so the wafer frames 20 in the body 110 are blocked by the blocking part 121 and unable to be taken out from the body 110. The storage container 100 of the present invention can protect the wafer frames 20 or other electronic devices placed in the body 110 from falling out.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:
1. A storage container comprising:
a body including a first inner surface, a second inner surface and an accommodation space having an access opening, the first and second inner surfaces are located at both sides of the accommodation space respectively, a plurality of first grooves are recessed from the first inner surface and a plurality of second grooves are recessed from the second inner surface, the plurality of first grooves and the plurality of second grooves connect with the accommodation space and the access opening, wherein each of the plurality of first grooves, each of the plurality of second grooves and the accommodation space form a pick-and-place path along a first direction; and a stop rod rotatably mounted on the body along a second direction intersecting with the first direction and including a blocking part and a recess, the blocking part is located at one side of the recess, the blocking part and the recess are configured to be located in the pick-and-place path, wherein the pick-and-place path is configured to be open when the recess is located in the pick-and-place path and configured to be closed when the blocking part is located in the pick-and-place path.

2. The storage container in accordance with claim 1 further comprising a restriction element, wherein the restriction element is mounted on the body and includes a restriction part, the restriction part is inserted into a guidance slot of the stop rod and configured to restrict a rotation angle of the stop rod.

3. The storage container in accordance with claim 2, wherein the recess is located in the pick-and-place path to open the pick-and-place path when the stop rod is configured to be rotated to make the restriction part to be located in a first end of the guidance slot, and wherein the blocking part is located in the pick-and-place path to close the pick-and-place path when the stop rod is configured to be rotated to make the restriction part to be located in a second end of the guidance slot.

4. The storage container in accordance with claim 3, wherein a top part of the stop rod is located at one end of the blocking part, the guidance slot is formed on the top part.

5. The storage container in accordance with claim 4, wherein a distance from the first end of the guidance slot to an upper surface of the top part is higher than that from the second end of the guidance slot to the upper surface of the top part.

6. The storage container in accordance with claim 3 further comprising an elastic element, wherein the elastic element is mounted in the body and configured to push the stop rod along the second direction, a bottom part of the stop rod is located at a first position when the restriction part is located in the first end of the guidance slot.

7. The storage container in accordance with claim 6, wherein the bottom part of the stop rod is configured to be moved to a second position from the first position when the stop rod is configured to be rotated to change the location of the restriction part from the first end of the guidance slot to the second end of the guidance slot.

8. The storage container in accordance with claim 6, wherein the body includes a first lateral plate and a second lateral plate, the first and second inner surfaces are inner surfaces of the first and second lateral plates respectively and face to each other, the first lateral plate includes an accommodation hole along the second direction, the elastic element is mounted in the accommodation hole, each of the plurality of first grooves connects with the accommodation hole, the stop rod is rotatably mounted in the accommodation hole, and the restriction part is located in the accommodation hole and inserted into the guidance slot of the stop rod.

9. The storage container in accordance with claim 8, wherein the pick-and-place path is configured to be open when the recess of the stop rod is located in each of the plurality of first grooves and configured to be closed when the blocking part of the stop rod is located in each of the plurality of first grooves.

10. The storage container in accordance with claim 8, wherein the accommodation hole has a window that is open on an outer surface of the first lateral plate, the blocking part or the recess of the stop rod is viewable from the window.

11. The storage container in accordance with claim 8, wherein the accommodation hole penetrates through a bottom surface of the first lateral plate such that the bottom part of the stop rod is configured to protrude from the bottom surface when the restriction part is located in the second end of the guidance slot.

12. The storage container in accordance with claim 8 further comprising a stop plate, wherein the stop plate is mounted on the first lateral plate, the accommodation hole penetrates through a top surface of the first lateral plate, and the elastic element is configured to be stuck between the stop plate and the stop rod.

13. The storage container in accordance with claim 8 further comprising a holding element, wherein the restriction element is mounted on the first lateral plate by the holding element.

14. The storage container in accordance with claim 5, wherein the guidance slot is a helix slot recessed on the stop rod.

15. The storage container in accordance with claim 1 further comprising a blocker, wherein the blocker is mounted in the accommodation space and close to an opening of the accommodation space.

* * * * *